United States Patent
Okamoto et al.

(10) Patent No.: US 10,663,493 B2
(45) Date of Patent: May 26, 2020

(54) ELECTRIC EQUIPMENT

(71) Applicant: HONDA MOTOR CO., LTD., Minato-ku, Tokyo (JP)

(72) Inventors: Noriaki Okamoto, Wako (JP); Masahiro Shimada, Wako (JP); Naoto Kochi, Wako (JP); Satoshi Hashino, Wako (JP); Satoru Fujita, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 10 days.

(21) Appl. No.: 15/992,320

(22) Filed: May 30, 2018

(65) Prior Publication Data

US 2018/0348261 A1    Dec. 6, 2018

(30) Foreign Application Priority Data

May 31, 2017    (JP) .................... 2017-108839

(51) Int. Cl.
*G01R 15/20*    (2006.01)
*G01R 19/15*    (2006.01)
*G01R 19/25*    (2006.01)

(52) U.S. Cl.
CPC ......... *G01R 15/202* (2013.01); *G01R 15/207* (2013.01); *G01R 19/15* (2013.01); *G01R 19/2513* (2013.01)

(58) Field of Classification Search
CPC .... G01R 19/2513; G01R 19/15; G01R 19/00; G01R 15/202; G01R 15/207; H02P 27/06; H02J 7/247; H01F 27/30; H01F 27/26
USPC ....................................... 324/117
See application file for complete search history.

(56) References Cited

U.S. PATENT DOCUMENTS

| | | | | |
|---|---|---|---|---|
| 3,813,579 | A | * | 5/1974 | Doyle .................. H01H 71/505 361/46 |
| 5,473,244 | A | * | 12/1995 | Libove ..................... G01R 1/22 324/126 |
| 2005/0218876 | A1 | * | 10/2005 | Nino .................... H02M 3/1582 323/282 |

(Continued)

FOREIGN PATENT DOCUMENTS

JP    2010-197155    9/2010
JP    2012-124977    6/2012

(Continued)

OTHER PUBLICATIONS

Japanese Office Action for Japanese Patent Application No. 2017-108839 dated Oct. 9, 2018.

(Continued)

*Primary Examiner* — Christopher P McAndrew
(74) *Attorney, Agent, or Firm* — Amin, Turocy & Watson, LLP

(57) ABSTRACT

An electric current sensor of electric equipment includes a detection element, a reference voltage line to which a reference voltage signal is transmitted, an output signal line to which an output signal of the detection element is transmitted, and a ground line connected to a ground potential. The reference voltage line, the output signal line, and the ground line are bundled together by a cylindrical member which does not contain metal, and in this state, the reference voltage line, the output signal line, and the ground line are routed inside a casing containing a reactor, and connected to a control device.

9 Claims, 12 Drawing Sheets

(56) References Cited

U.S. PATENT DOCUMENTS

| | | | | |
|---|---|---|---|---|
| 2009/0316453 | A1* | 12/2009 | Manabe | H02M 3/1582 363/78 |
| 2010/0052598 | A1* | 3/2010 | Hayashi | H02M 7/797 318/759 |
| 2011/0007531 | A1* | 1/2011 | Sakakibara | H02M 5/4585 363/37 |
| 2013/0154531 | A1* | 6/2013 | Furutani | B60L 7/14 318/400.26 |
| 2013/0169204 | A1* | 7/2013 | Kuboe | H02M 5/458 318/400.3 |
| 2013/0176753 | A1* | 7/2013 | Swamy | H02M 1/4216 363/37 |
| 2013/0181646 | A1* | 7/2013 | Takata | H02M 1/12 318/400.29 |
| 2014/0184212 | A1 | 7/2014 | Yamaguchi et al. | |
| 2014/0306640 | A1* | 10/2014 | Yamamoto | H02P 27/08 318/504 |
| 2015/0365019 | A1* | 12/2015 | Yamamoto | H02P 1/022 318/490 |
| 2015/0365037 | A1* | 12/2015 | Watabu | H02P 27/06 318/400.3 |
| 2016/0226423 | A1* | 8/2016 | Watabu | H02P 27/06 |
| 2016/0268922 | A1* | 9/2016 | Hou | H02M 1/12 |
| 2016/0329846 | A1* | 11/2016 | Shimomugi | F24F 7/007 |
| 2016/0365806 | A1* | 12/2016 | Ichihara | H02M 7/125 |
| 2017/0005581 | A1* | 1/2017 | Fukumasu | H02M 3/28 |
| 2017/0017209 | A1* | 1/2017 | Yamamoto | H02P 3/02 |
| 2017/0036554 | A1* | 2/2017 | Kumazawa | B60L 3/0023 |
| 2017/0110975 | A1* | 4/2017 | Nishi | H02M 3/33569 |
| 2017/0117816 | A1* | 4/2017 | Ohta | H02P 27/06 |
| 2017/0141716 | A1* | 5/2017 | He | H02P 25/03 |

FOREIGN PATENT DOCUMENTS

| | | |
|---|---|---|
| JP | 2016-066720 | 4/2016 |
| JP | 2016-066744 | 4/2016 |
| JP | 2017-093221 | 5/2017 |
| WO | 2013/031291 | 3/2013 |

OTHER PUBLICATIONS

Japanese Office Action for Japanese Patent Application No. 2017-108839 dated Dec. 18, 2018.

* cited by examiner

COMPARATIVE EXAMPLE

EMBODIMENT OF THE PRESENT INVENTION

ELECTRIC EQUIPMENT

CROSS-REFERENCE TO RELATED APPLICATION

This application is based upon and claims the benefit of priority from Japanese Patent Application No. 2017-108839 filed on May 31, 2017, the contents of which are incorporated herein by reference.

BACKGROUND OF THE INVENTION

Field of the Invention

The present invention relates to electric equipment including an electric current sensor.

Description of the Related Art

Japanese Laid-Open Patent Publication No. 2010-197155 discloses a magnetic flux detection device 100 using a Hall element 10 (FIG. 1, paragraphs [0018], [0027]). The Hall element 10 at least includes a reference terminal tb, a power supply terminal td, and an output terminal "to" (paragraph [0024]). The reference terminal tb is used for setting a reference potential. Power supply voltage is applied to the power supply terminal td in a manner that magnetic flux Φ can be detected. The output terminal "to" outputs an output signal in correspondence with the detected magnetic flux Φ (paragraph [0024]). Further, the Hall element 10 includes a non-connection terminal tn, e.g., used for output noise adjustment (paragraph [0025]).

The terminals tb, td, to, tn are connected to lands 51a to 51d provided on a substrate 50, respectively (FIG. 2, FIG. 3, paragraph [0025]). Among them, the lands 51a 51b, 51d are connected to connection terminals 52a to 52c, and connected to the outside, respectively (paragraph [0026]).

Japanese Laid-Open Patent Publication No. 2016-066744 discloses a compound type reactor (or magnetic coupling type reactor) used in a DC/DC converter, etc.

SUMMARY OF THE INVENTION

As described above, in Japanese Laid-Open Patent Publication No. 2010-197155, the reference terminal tb, the power supply terminal td, and the output terminal "to" are connected to the outside through the lands 51a, 51b, 51d, and the connection terminals 52a to 52c (FIGS. 2 and 3, and paragraphs [0025] and [0026]). It appears that Japanese Laid-Open Patent Publication No. 2010-197155 does not disclose any specific structure for connection of the connection terminals 52a to 52c to the outside.

Assuming that wiring lines for connecting the connection terminals 52a to 52c to the external devices are positioned around a magnetic field generation source such as a magnetic coupling type reactor, etc. disclosed in Japanese Laid-Open Patent publication No. 2016-066744, the wiring lines may be influenced by leakage magnetic flux from the magnetic field generation source. In any of Japanese Laid-Open Patent Publication No. 2010-197155 and Japanese Laid-Open Patent Publication No. 2016-066744, there is no consideration about the influence (noise, etc.) of the leakage magnetic flux from the magnetic on the wiring lines transmitting the outputs from the Hall element 10.

The problem of this type is not limited to the case of the Hall element, and is present as well also in the outputs from other detection elements.

The present invention has been made taking the above problem into account, and an object of the present invention is to provide electric equipment which makes it possible to suppress the detection error in an output signal outputted from an electric current sensor.

Electric equipment according to the present invention includes a reactor, a switching element connected to the reactor, a control device configured to control switching of the switching element, and an electric current sensor provided around the reactor, and configured to detect electric current flowing through an electric power line. The electric current sensor includes a detection element, a reference voltage line to which a reference voltage signal is transmitted, an output signal line to which an output signal of the detection element is transmitted, and a ground line connected to a ground potential. In a state in which the reference voltage line, the output signal line, and the ground line are bundled together by a cylindrical member which does not contain metal, the reference voltage line, the output signal line, and the ground line are routed inside a casing containing the reactor, and connected to the control device.

In the present invention, the reference voltage line, the output signal line, and the ground line of the electric current sensor (The reference voltage line, the output signal line, and the ground line herein include covered electric lines connected to the reference voltage line, the output signal line, and the ground line. Lines mentioned hereinafter also include covered electric lines connected to the lines.) are bundled together by a cylindrical member which does not contain metal. Therefore, the reference voltage line, the output signal line, and the ground line are provided close to one another, and in this state, the reference voltage line, the output signal line, and the ground line are held together (without using any metal shield lines such as braided wires). In the structure, even if the three lines are influenced by a variable magnetic field around the reactor, the influence is equally applied to each of the three lines. Therefore, in the case where the control device detects the electric current of the electric power line based on the voltage difference between the reference voltage and the voltage of the output signal (both of the voltages are detected in relation with the ground voltage), it becomes possible to suppress the detection error in the output signal (i.e., electric current). In the case where at least one of the reference voltage line and the ground line is used in common by the plurality of electric current sensors, it is possible to bundle four or more lines using the above cylindrical member.

Further, in the present invention, the reference voltage line, the output signal line, and the ground line of the electric current sensor are bundled together by a cylindrical member which does not contain metal. In this state, the reference voltage line, the output signal line, and the ground line are routed inside a casing, and connected to the control device. In the case of using a cylindrical member containing metal (metal shield member, etc.), heat is generated in the shield member by eddy current generated in the variable magnetic field around the reactor. However, in the present invention, the lines are bundled together using the cylindrical member which does not contain metal. Therefore, it becomes possible to suppress heat generation around the reactor.

In the case where a plurality of the electric current sensors are provided inside the casing, for each of the plurality of electric current sensors, the one reference voltage line, the one output signal line, and the one ground line may be inserted into the one cylindrical member, and bundled together. In this state, the one reference voltage line, the one output signal line, and the one ground line may be routed inside the casing, and connected to the control device. In this manner, it becomes possible to bundle the reference voltage line, the output signal line, and the ground line together for each of the electric current sensors. Therefore, in comparison with the case where a plurality of reference voltage lines, a plurality of output signal lines, and a plurality of ground lines are bundled together by one cylindrical member, it becomes easy to position the lines for each of the electric current sensors. Thus, for each of electric current sensors, in the case where the control device detects electric current of the electric power line, e.g., based on the difference between the reference voltage (detected in relation with the ground voltage) and the voltage of the output signal, it becomes possible to suppress the detection error in each of the output signals (i.e., in each of the electric currents).

The reference voltage line, the output signal line, and the ground line may be twisted from one another (entwined with one another), and in this state, the reference voltage line, the output signal line, and the ground line may be inserted into the cylindrical member, and bundled together. In the above structure, since the reference voltage line, the output signal line, and the ground line are twisted from one another, the influence of the variable magnetic field around the reactor tends to be applied to the three lines equally. Therefore, in comparison with the case where the three lines extend straight without being twisted from one another, it becomes possible to suppress the detection error in the output signal (i.e., electric current).

In the case where a plurality of the electric current sensors are provided inside the casing, the plurality of electric current sensors may include a common reference voltage line to which a reference voltage signal is transmitted, a first output signal line and a second output signal line to each of which an output signal of the detection element is transmitted individually, and a common ground line connected to a ground potential. The reference voltage line, the first output signal line, the second output signal line, and the ground line are inserted into the one cylindrical member and bundled together. In this state, the reference voltage line, the first output signal line, the second output signal line, and the ground line may be routed inside the casing, and connected to the control device. In this manner, it becomes possible to bundle the reference voltage line, the first output signal line, the second output signal line, and the ground line together. Therefore, using the reference voltage line and the ground line in common, it becomes possible to simplify the structure of the electric equipment, and suppress the detection error in the output signal (i.e., electric current).

The control device may be configured to switch the switching element using a maximum switching frequency included in a range of 10 to 20 kHz. The inventors of the present application found that, (even assuming that heat generation in the metal shield line is permissible), in the case where switching is performed in the range of 10 to 20 kHz, the metal shield line does not exert its function satisfactorily. In the present invention, even in the case where the reactor is switched at the maximum switching frequency included in the above range, it becomes possible to suppress the detection error in the output signal (i.e., electric current) of the electric current sensor.

The reference voltage line, the output signal line and the ground line bundled with the cylindrical member may be provided substantially in parallel with an axis of the reactor inside the casing. In the structure, it becomes possible to adjust the orientations of the three or more lines to become closer to the orientation of the magnetic flux, and suppress generation of noises in the three or more lines.

For example, the reactor may be a magnetic coupling type reactor including four winding parts. Therefore, in a situation where the orientation of the magnetic field changes in the four winding parts, even in the case where the three or more lines (electric lines) are provided around the reactor, it becomes possible to suppress the detection error in the output signal (i.e., electric current) of the electric current sensor.

In the case where the detection element is a Hall element, the output signal line may be an output signal line of an operational amplifier configured to output a voltage difference of two output lines connected to the Hall element. In this manner, by bundling the output signal line together with the reference voltage line after detection of the voltage difference between the two output lines, since the similar noises are introduced into both of the reference voltage line and the output signal line, it becomes possible to suppress variation in the readout values.

According to the present invention, it is possible to suppress the detection error in the output signal outputted from the electric current sensor.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A. Embodiment

A-1. Structure

A-1-1. Overall Structure

Figure 1:
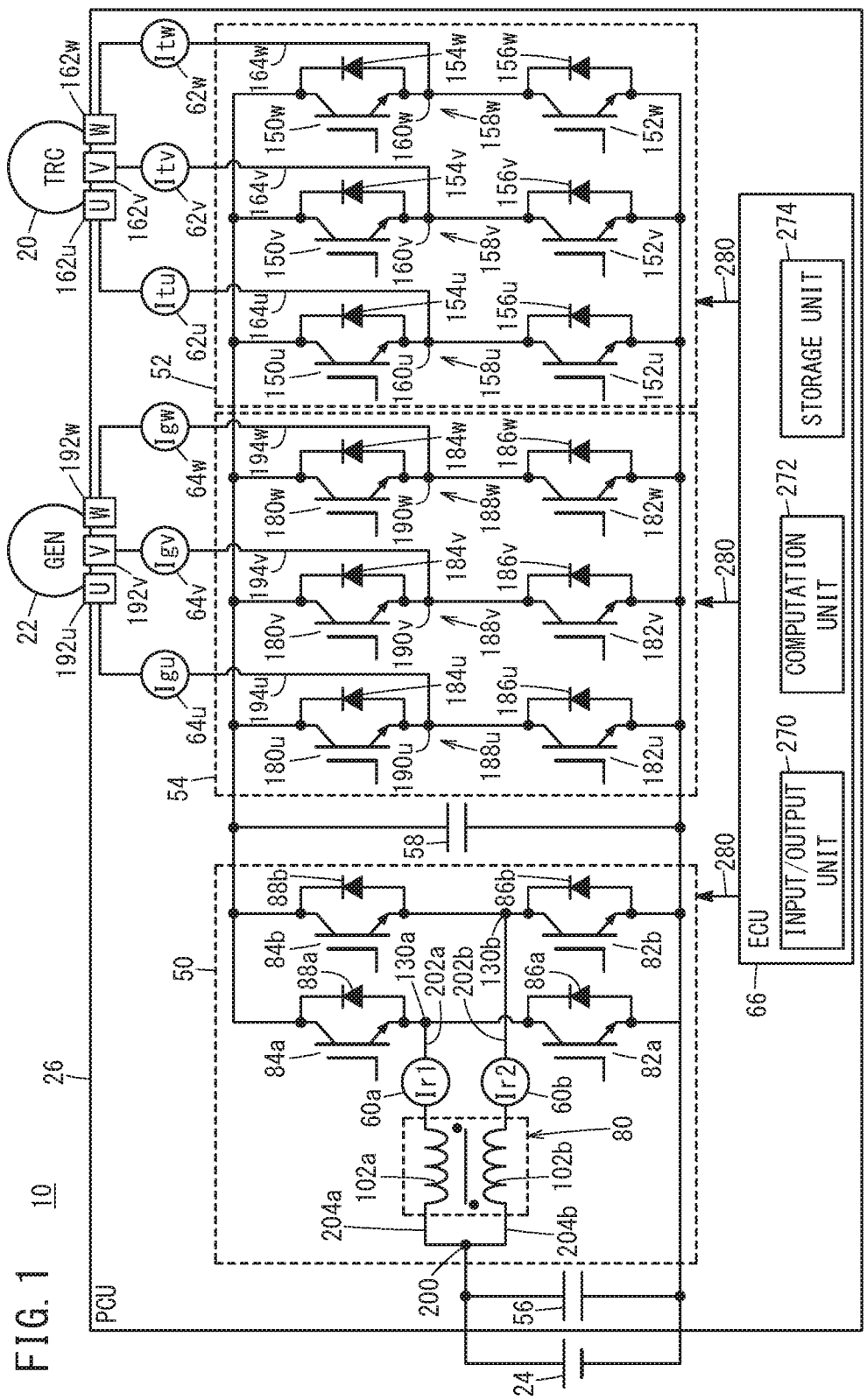
FIG. 1 is an electric circuit diagram schematically showing a vehicle including a power control unit (hereinafter referred to as the "PCU") as electric equipment according to one embodiment of the present invention.

FIG. 1 is an electric circuit diaphragm schematically showing structure of a vehicle 10 including a power control unit 26 (hereinafter referred to as the "PCU 26") as electric equipment according to one embodiment of the present invention. In addition to the PCU 26, the vehicle 10 includes a traction motor 20, a generator 22, and a high voltage battery 24 (hereinafter also referred to as the "battery 24" or "BAT 24"). The vehicle 10 is a hybrid vehicle. As a traction drive source, the vehicle 10 includes an engine (not shown) in addition to the traction motor 20. As described later, the vehicle 10 may be a vehicle of another type. The generator 22 performs power generation based on a drive force of the engine. The generator 22 may be used as the traction drive source.

The PCU 26 converts or adjusts electric power from the battery 24, and supplies the electric power to the traction motor 20. Further, the PCU 26 converts or adjusts power generation electric power Pgen of the generator 22 and power generation electric power (regenerative electric power Preg) of the traction motor 20 to charge the battery 24.

A-1-2. Traction Motor 20

For example, the traction motor 20 is a three-phase AC brushless type motor. The traction motor 20 generates a drive force Ftrc as a traction drive source of the vehicle 10, and provides the driving force Ftrc for the wheels (drive wheels) (not shown). That is, the traction motor 20 is driven by one of, or by both of electric power Pbat from the high voltage battery 24 and the electric power Pgen from the generator 22. Further, the traction motor 20 performs regenerative operation at the time of braking the vehicle 10, and supplies the regenerative electric power Preg to the battery 24. The regenerative electric power Preg may be supplied to electric auxiliary equipment (not shown).

Hereinafter, the traction motor 20 may also be referred to as the TRC motor 20 or the motor 20. The TRC motor 20 may have the function of a generator, in addition to, or instead of the function of the traction motor. Hereinafter, the parameters related to the traction motor 20 are labeled with "TRC" or "trc", or "t". Further, in FIG. 1, etc., the traction motor 20 is labeled with "TRC".

A-1-3. Generator 22

The generator 22 is a three-phase AC brushless type generator, and functions as a generator for performing power generation using the drive force Feng from the engine. The electric power Pgen generated by the generator 22 is supplied to the battery 24, the traction motor 20, or electrically operated auxiliary devices.

Hereinafter, the generator 22 will also be referred to as the GEN 22. The GEN 22 may have the function of a traction motor, in addition to, or instead of the function of the generator (power generator). Hereinafter, the parameters related to the generator 22 are labeled with "GEN" or "gen", or "g". Further, in FIG. 1, etc. the generator 22 is labeled with "GEN". The generator 22 may be used as a starter motor of the engine.

A-1-4. High Voltage Battery 24

The high voltage battery 24 is an energy storage including a plurality of battery cells, and capable of outputting high voltage (several hundreds of volts). For example, a lithium ion secondary battery, or a nickel hydrogen (or nickel-metal hydride) secondary battery may be used as the high voltage battery 24. Instead of, or in addition to the battery 24, an energy storage such as a capacitor may be used.

A-1-5. PCU 26

A-1-5-1. Overview of PCU 26

The PCU 26 converts or adjusts the electric power from the battery 24, and supplies the electric power to the traction motor 20. Further, the PCU 26 converts or adjusts the power generation electric power Pgen of the generator 22 and the regenerative electric power Preg of the traction motor 20, and charges the battery 24.

Figure 6:
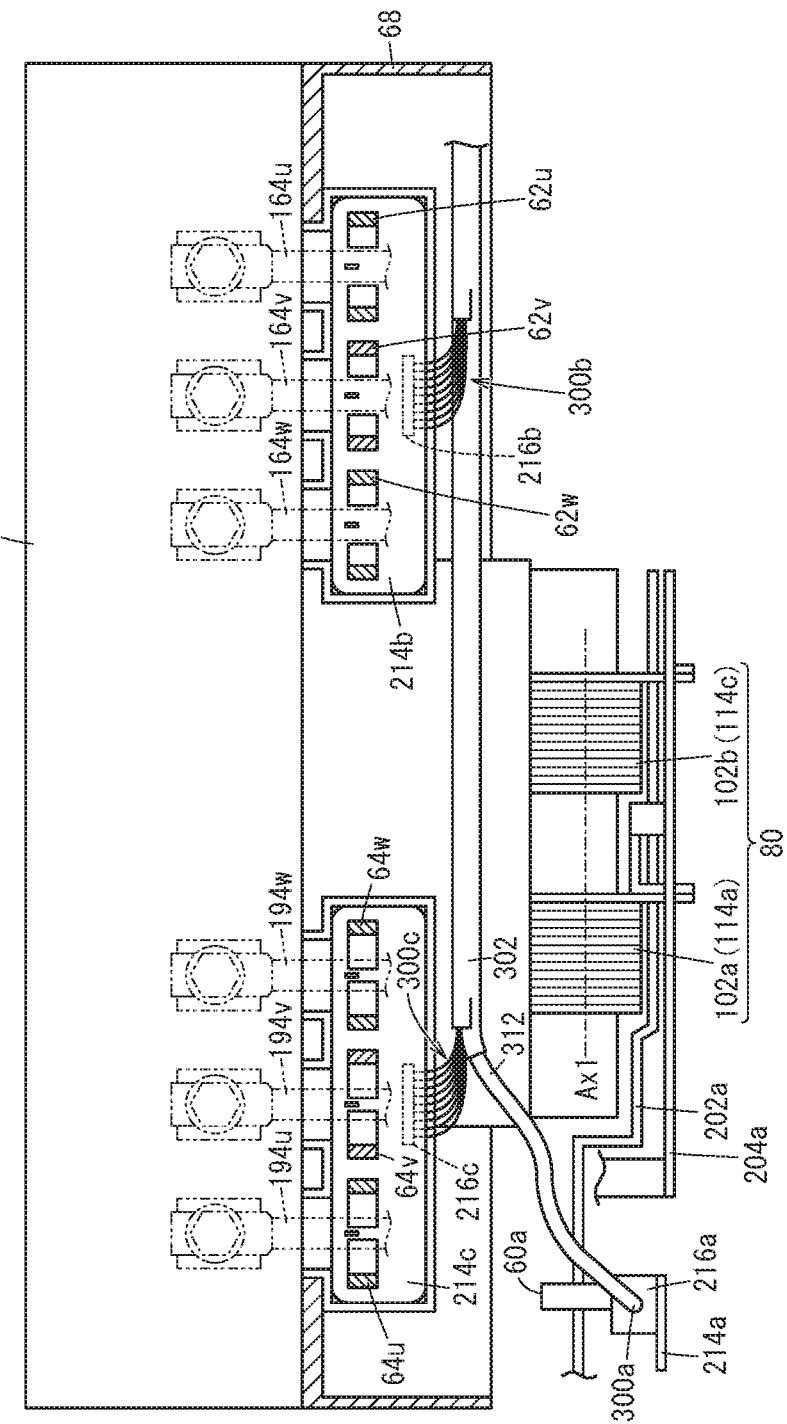
FIG. 6 is a side view schematically showing the layout of a part of the PCU according to the embodiment.
Figure 7:
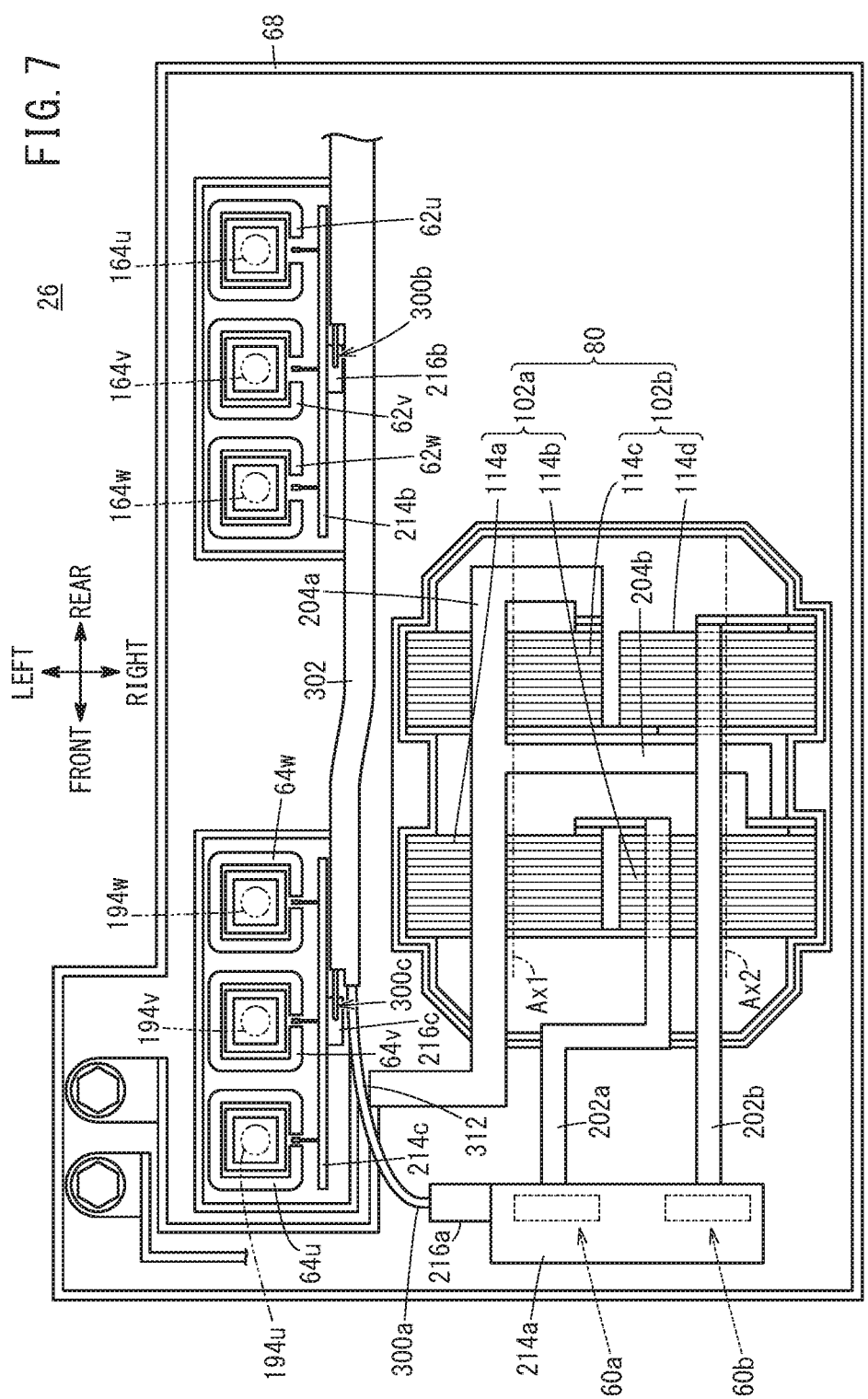
FIG. 7 is a bottom view schematically showing the layout of a part of the PCU according to the embodiment.
Figure 8:
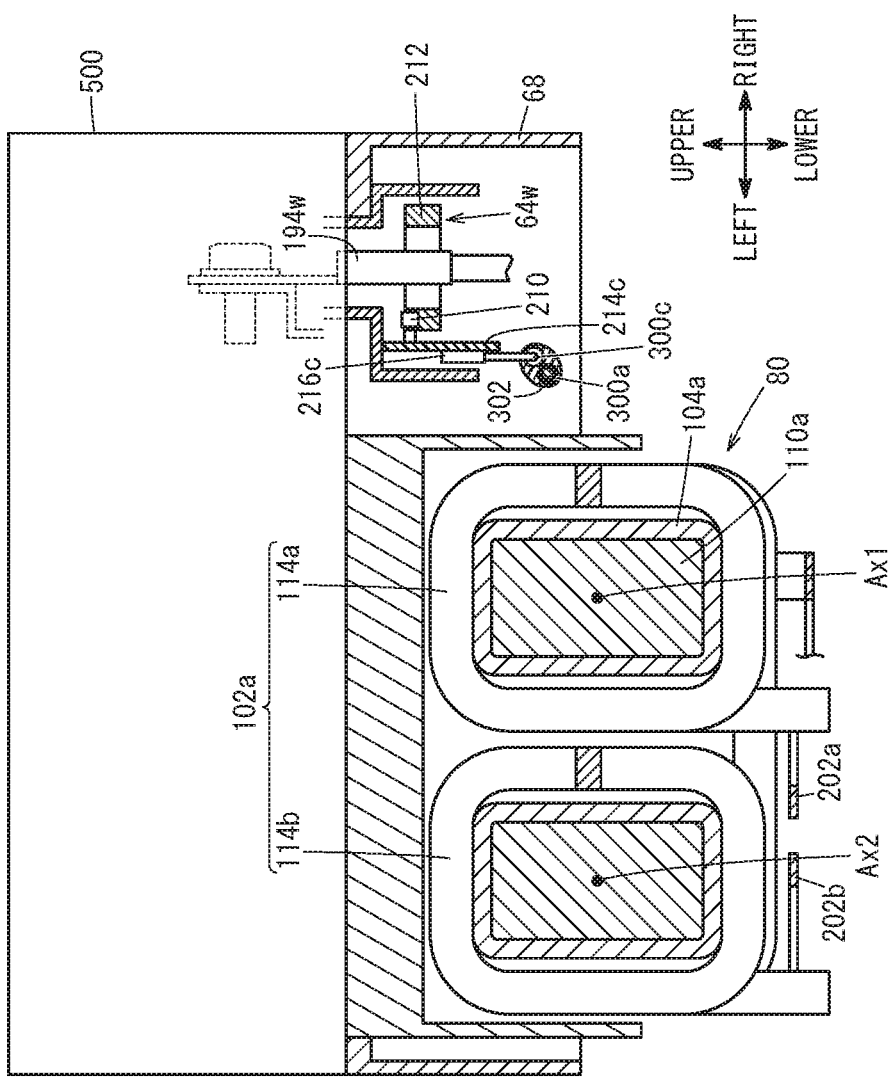
FIG. 8 is a front view schematically showing the layout of a part of the PCU according to the embodiment.

As shown in FIG. 1, the PCU 26 includes a DC/DC converter 50, a first inverter 52, a second inverter 54, a first capacitor 56, a second capacitor 58, reactor electric current sensors 60$a$, 60$b$, TRC electric current sensors 62$u$, 62$v$, 62$w$, GEN electric current sensors 64$u$, 64$v$, 64$w$, and an electronic control device (or an electronic control unit) 66 (hereinafter referred to as the "ECU 66"). Components of the PCU 26 are provided inside a casing 68 (FIGS. 6 to 8).

A-1-5-2. DC/DC Converter 50

A-1-5-2-1. Overview of DC/DC Converter 50

The DC/DC converter 50 (hereinafter also referred to as the "converter 50") is a step-up/down (voltage boost/buck) converter. The converter 50 steps up the output voltage Vbat (hereinafter also referred to as the "battery voltage Vbat") of the battery 24, and outputs the stepped up voltage to the TRC motor 20. Further, the converter 50 steps down the output voltage Vgen (hereinafter also referred to as the "GEN voltage Vgen") of the generator 22 or the output voltage Vreg (hereinafter also referred to as the "regenerative voltage Vreg") of the traction motor 20, and outputs the stepped down voltage to the battery 24.

The converter 50 includes a reactor 80, lower switching elements 82$a$, 82$b$, and upper switching elements 84$a$, 84$b$. Diodes 86$a$, 86$b$, 88$a$, 88$b$ are connected to the lower switching elements 82$a$, 82$b$ and the upper switching elements 84$a$, 84$b$ in parallel, respectively.

At the time of stepping up the battery voltage Vbat, after turning on the lower switching elements 82$a$, 82$b$ at the same time to store electric energy in the reactor 80, the lower switching elements 82$a$, 82$b$ are turned off at the same time to release the electric energy stored in the reactor 80 to the traction motor 20. When the GEN voltage Vgen or the regenerative voltage Vreg is stepped down, the upper switching elements 84$a$, 84$b$ are turned on to store electric energy in the reactor 80, and then, the upper switching elements 84$a$, 84$b$ are tuned off to charge the battery 24 using the electric energy stored in the reactor 80.

A-1-5-2-2. Reactor 80

Figure 2:
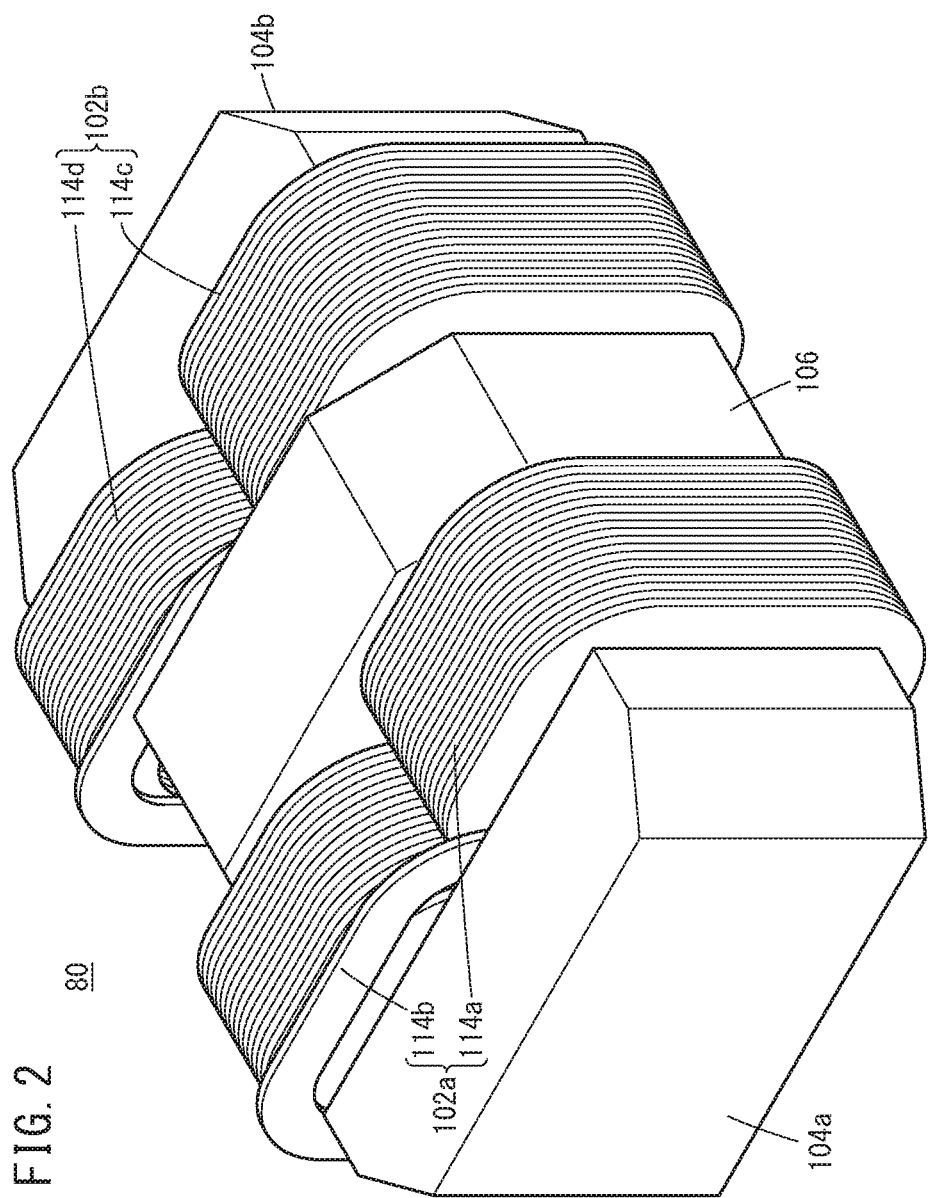
FIG. 2 is a perspective view schematically showing a reactor according to the embodiment.
Figure 3:
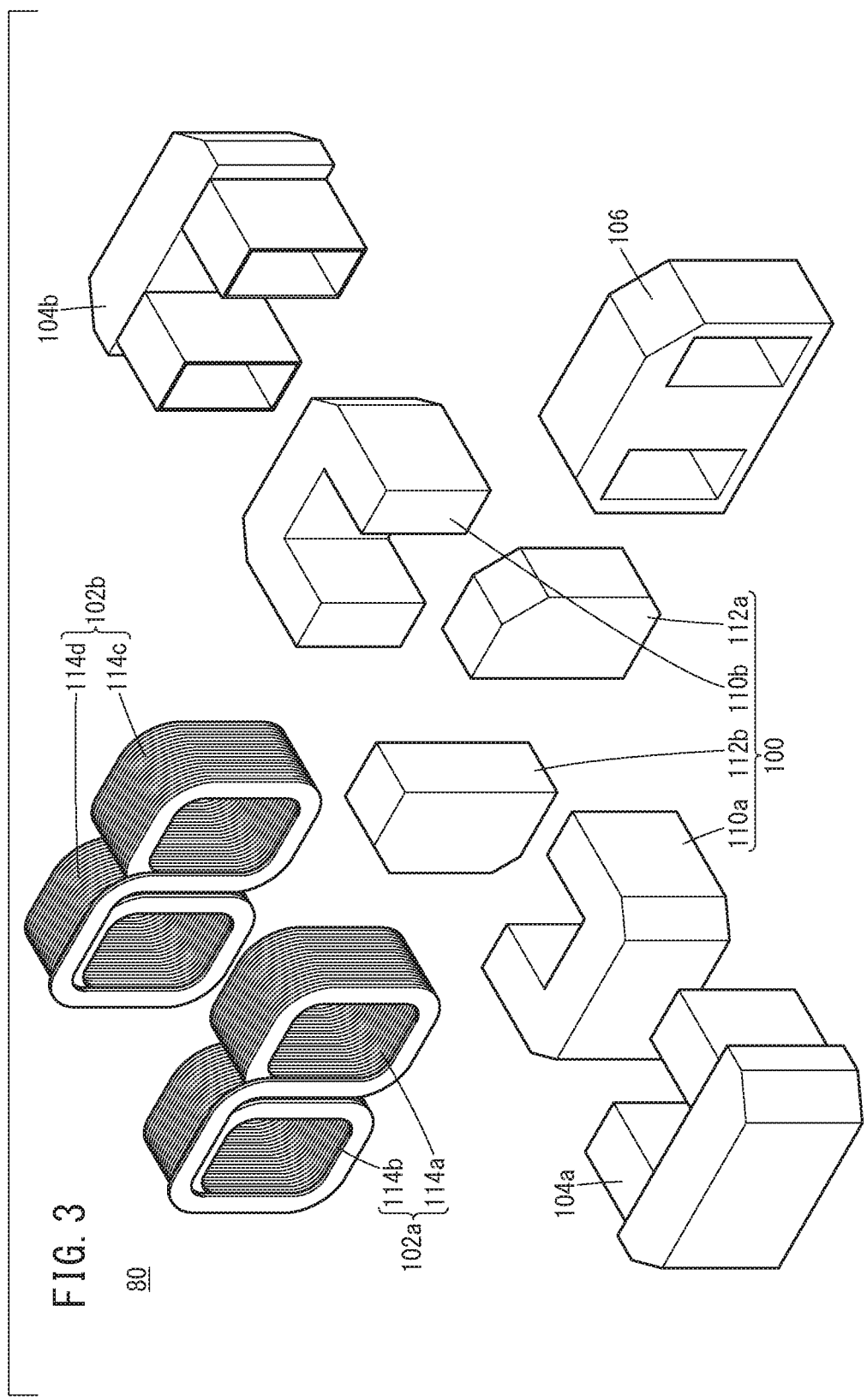
FIG. 3 is an exploded perspective view schematically showing the reactor according to the embodiment.

FIG. 2 is a perspective view schematically showing the reactor 80 according to an embodiment of the present invention. FIG. 3 is an exploded perspective view schematically showing the reactor 80 according to the embodiment. In the embodiment, though the reactor 80 is a magnetic coupling type reactor, the reactor 80 may be of a reactor of another type.

As shown in FIGS. 2 and 3, the reactor 80 includes an annular core 100 (FIG. 3), two coupling coils 102a, 102b, first core cover parts 104a, 104b, and a second core cover part 106. The annular core 100 is made up of combination of two U-shaped cores 110a, 110b, two I-shaped cores 112a, 112b to have a "θ" shape of Greek alphabet letter.

The coupling coil 102a is divided into a first winding part 114a and a second winding part 114b, and wound around the annular core 100. The coupling coil 102b is divided into a third winding part 114c and a fourth winding part 114d, and wound around the annular core 100.

The reactor 80 may adopt structure as described in any of Japanese Laid-Open Patent Publication No. 2010-197155 and Japanese Laid-Open Patent Publication No. 2016-066720.

A-1-5-2-3. Lower Switching Elements 82a, 82b and Upper Switching Elements 84a, 84b As shown in FIG. 1, the lower switching element 82a is connected between the negative electrode of the battery 24 and a branch point 130a. The lower switching element 82b is connected between the negative electrode of the battery 24 and a branch point 130b. The upper switching element 84a is connected between the branch point 130a and a point between the traction motor 20 and the generator 22. The upper switching element 84b is connected between the branch point 130b and a point between the traction motor 20 and the generator 22.

The lower switching elements 82a, 82b and the upper switching elements 84a, 84b are made up of MOSFETs (metal-oxide-semiconductor field-effect transistors), IGBTs (insulated gate bipolar transistors), etc.

A-1-5-3. First Inverter 52

The first inverter 52 converts the DC electric current from the battery 24 to the AC electric current, and supplies the AC electric current to the traction motor 20. Further, the first inverter 52 converts AC electric current from the traction motor 20 into the DC electric current, and supplies the DC electric current to the battery 24.

As shown in FIG. 1, the first inverter 52 includes three-phase upper switching elements 150u, 150v, 150w, and three-phase lower switching elements 152u, 152v, 152w. Diodes 154u, 154v, 154w are connected to the upper switching elements 150u, 150v, 150w in parallel. Diodes 156u, 156v, 156w are connected to the lower switching elements 152u, 152v, 152w in parallel. The upper switching element 150u and the lower switching element 152u form a U-phase arm 158u. The upper switching element 150v and the lower switching element 152v form a V-phase arm 158v. The upper switching element 150w and the lower switching element 152w form a W-phase arm 158w.

In the U-phase arm 158u, a node 160u between the upper switching element 150u and the lower switching element 152u is connected to a U-phase terminal 162u of the traction motor 20 through a bus bar 164u. In the V-phase arm 158v, a node 160v between the upper switching element 150v and the lower switching element 152v is connected to a V-phase terminal 162v of the traction motor 20 through a bus bar 164v. In the W-phase arm 158w, a node 160w between the upper switching element 150w and the lower switching element 152w is connected to a W-phase terminal 162w of the traction motor 20 through a bus bar 164w. Hereinafter, the bus bars 164u, 164v, 164w will also be referred to as a bus bar 164, collectively.

A-1-5-4. Second Inverter 54

The second inverter 54 converts the AC electric current from the generator 22 into the DC electric current, and supplies the DC electric current to the battery 24. Further, in the case where the generator 22 is used as a traction drive source, the second inverter 54 converts the DC electric current from the battery 24 into the AC electric current, and supplies the AC electric current to the generator 22.

As shown in FIG. 1, the second inverter 54 includes three-phase upper switching elements 180u, 180v, 180w, and three-phase lower switching elements 182u, 182v, 182w. Diodes 184u, 184v, 184w are connected to the upper switching elements 180u, 180v, 180w in parallel. Diodes 186u, 186v, 186w are connected to the lower switching elements 182u, 182v, 182w in parallel. The upper switching element 180u and the lower switching element 182u form a U-phase arm 188u. The upper switching element 180v and the lower switching element 182v form a V-phase arm 188v. The upper switching element 180w and the lower switching element 182w form a W-phase arm 188w.

In the U-phase arm 188u, a node 190u between the upper switching element 180u and the lower switching element 182u is connected to a U-phase terminal 192u of the generator 22 through a bus bar 194u. In the V-phase arm 188v, a node 190v between the upper switching element 180v and the lower switching element 182v is connected to a V-phase terminal 192v of the generator 22 through a bus bar 194v. In the W-phase arm 188w, a node 190w between the upper switching element 180w and the lower switching element 182w is connected to a W-phase terminal 192w of the generator 22 through a bus bar 194w. Hereinafter, the bus bars 194u, 194v, 194w are referred to as a bus bar 194, collectively.

A-1-5-5. First Capacitor 56 and Second Capacitor 58

The first capacitor 56 and the second capacitor 58 function as smoothing capacitors.

A-1-5-6. Reactor Electric Current Sensors 60a, 60b

A-1-5-6-1. Overview of Reactor Electric Current Sensors 60a, 60b

The reactor electric current sensor 60a (FIG. 1) detects electric current Ir1 (hereinafter also referred to as the reactor electric current Ir1") flowing between the coupling coil 102a and the branch point 130a. Stated otherwise, the reactor electric current sensor 60a detects the electric current Ir1 flowing through a bus bar 202a connecting the coupling coil 102a and the branch point 130a. The reactor electric current sensor 60a may be provided between the positive electrode (branch point 200) of the battery 24 and the coupling coil 102a. Stated otherwise, the reactor electric current sensor 60a may detect electric current flowing through a bus bar 204a connecting the branch point 200 and the coupling coil 102a.

The reactor electric current sensor 60b detects the electric current (hereinafter also referred to as the "reactor electric current Ir2") flowing between the coupling coil 102b and the branch point 130b. Stated otherwise, the reactor electric current sensor 60b detects electric current Ir2 flowing through a bus bar 202b connecting the coupling coil 102b and the branch point 130b. The reactor electric current sensor 60b may be provided between the positive electrode (branch point 200) of the battery 24 and the coupling coil 102b. Stated otherwise, the reactor electric current sensor 60b may detect electric current flowing through a bus bar 204b connecting the branch point 200 and the coupling coil 102b.

Hereinafter, the reactor electric current sensors 60a, 60b will be referred to as the electric current sensor 60 or the sensor 60 collectively.

A-1-5-6-2. Specific Structure of Reactor Electric Current Sensors 60a, 60b

Figure 4:
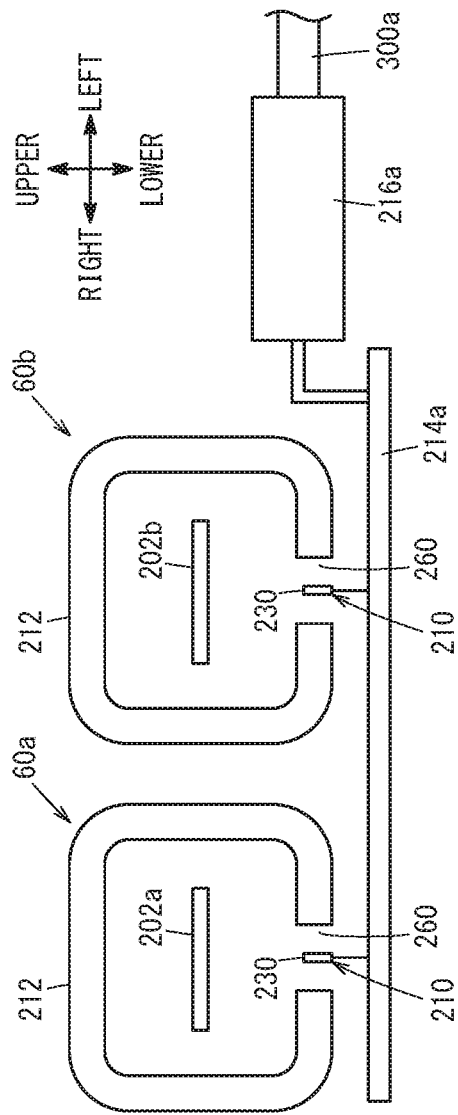
FIG. 4 is a front view showing reactor electric current sensors and an area around the reactor electric current sensors according to the embodiment.

FIG. 4 is a front view showing reactor electric current sensors 60a, 60b and an area around the reactor electric current sensors 60a, 60b according to the embodiment of the present invention. The directions shown in FIG. 4 and FIGS. 6 to 8 and 10 described later are based on the vehicle 10. Each of the electric current sensors 60a, 60b includes a Hall IC 210 (IC: integrated circuit) and a magnetic core 212 (hereinafter also referred to as the "core 212"). Further, the electric current sensors 60a, 60b have a common substrate 214a. The Hall ICs 210 are fixed to the substrate 214a. A connector 216a is provided at one end of the substrate 214a. A wiring line 300a connected to the connector 216a will be described later with reference to FIGS. 6 to 9, 11, and 12. The Hall IC 210 and the core 212 of the electric current sensor 60a and the Hall IC 210 and the core 212 of the electric current sensor 60b have the structure according to the same specification.

Figure 5:
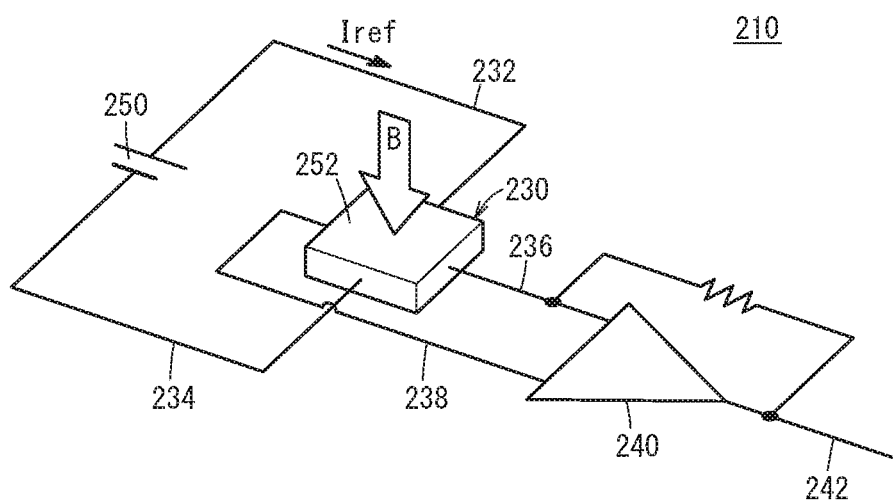
FIG. 5 is a view illustrating a detection principle of a Hall element included in a Hall IC according to the embodiment.

FIG. 5 is a view illustrating a detection principle of a Hall element 230 included in the Hall IC 210 according to the embodiment. The Hall element 230 is a magnetism detection element for detecting a magnetic field B or magnetic flux φ. Though the Hall element 230 is known in general, for ease of understanding of the embodiment of the present invention, the description about the Hall element 230 will be given below.

The Hall IC 210 includes, in addition to the Hall element 230, a reference voltage line 232 (power supply voltage line), a ground line 234, and output lines 236, 238. The output lines 236, 238 are connected to an operational amplifier 240, and the output of the operational amplifier 240 is supplied to a signal line 242. In the Hall IC 210, the reference voltage line 232 and the ground line 234 are connected to a low voltage power supply 250, and electric current (reference electric current Iref) is supplied thereto. In this state, when the magnetic field B is applied perpendicularly to a magnetic field detection surface 252 of the Hall element 230, (stated otherwise, when the magnetic field B is applied perpendicularly to the reference electric current Iref), an electromotive force E is generated in a direction perpendicular to the reference electric current Iref and the magnetic field B (i.e., the output lines 236, 238). Therefore, by collecting the electromotive force E through the operational amplifier 240, it is possible to know the intensity of the magnetic field B (or electric current which generates the magnetic field B).

The core 212 (FIG. 4) is made of magnetic material basically in the form of an annular shape. A gap 260 is formed in part of the core 212, for providing the Hall IC 210 (in particular, Hall element 230). An air as insulating material is present between the Hall IC 210 and the core 212. Insulating material other than the air may be provided between the Hall IC 210 and the core 212. Using the core 212, it is possible to converge the magnetic flux φ generated around detection target conductors (bus bars 202a, 202b herein), and improve the sensitivity of the Hall element 230.

As can be seen from FIG. 4, in the state where the Hall element 230 is provided in the gap 260, the Hall element 230 is provided such that the magnetic field detection surface 252 (FIG. 5) of the Hall element 230 faces the core 212 (to face in a left-right direction in FIG. 4). Further, part of the Hall IC 210 other than the Hall element 230 is provided on the sensor substrate 214a. Though the Hall element 230 is described as part of the Hall IC 210, the Hall element 230 may be handled as a component part which is provided separately from the Hall IC 210.

A-1-5-7. TRC Electric Current Sensors 62u, 62v, 62w

A-1-5-7-1. Overview of TRC Electric Current Sensors 62u, 62v, 62w

As shown in FIG. 1, TRC electric current sensors 62u, 62v, 62w (hereinafter also referred to as the "electric current sensors 62u, 62v, 62w" or the "sensors 62u, 62v, 62w") detect electric currents Itu, Itv, Itw flowing between the first inverter 52 and the traction motor 20.

More specifically, the sensor 62u detects electric current Itu (hereinafter also referred to as the "TRC electric current Itu" or the "U-phase electric current Itu") flowing through the bus bar 164u connecting the U-phase arm 158u and the U-phase terminal 162u of the motor 20. The sensor 62v detects electric current Itv (hereinafter also referred to as the "TRC electric current Itv" or the "V-phase electric current Itv") flowing through the bus bar 164v connecting the V-phase arm 158v and the V-phase terminal 162v of the motor 20. The sensor 62w detects electric current Itw (hereinafter also referred to as the "TRC electric current Itw" or the "W-phase electric current Itw") flowing through the bus bar 164w connecting the W-phase arm 158w and the W-phase terminal 162w of the motor 20.

Hereinafter, the TRC electric current sensors 62u, 62v, 62w will be referred to as the TRC electric current sensor 62 or the sensor 62 collectively. Further, the electric currents Itu, Itv, Itw will be referred to as the electric current It collectively. In the embodiment of the present invention, the number of the sensors 62 is three. Alternatively, the number of the sensors 62 may be two or four or more.

A-1-5-7-2. Specific Structure of TRC Electric Current Sensors 62u, 62v, 62w The TRC electric current sensors 62u, 62v, 62w have the same structure as the reactor electric current sensors 60a, 60b. That is, the sensors 62u, 62v, 62w include Hall element ICs 210 (FIG. 5), magnetic cores 212, and a substrate 214b (FIG. 6, etc.) which is common to the sensors 62u, 62v, 62w. A wiring line 300b is connected to one end of the substrate 214b through a connector 216b. The wiring line 300b will be described later with reference to FIGS. 6 to 9, FIG. 11, and FIG. 12.

A-1-5-8. GEN Electric Current Sensors 64u, 64v, 64w

A-1-5-8-1. Overview of GEN Electric Current Sensors 64u, 64v, 64w

As shown in FIG. 1, GEN electric current sensors 64u, 64v, 64w (hereinafter also referred to as the "electric current sensors 64u, 64v, 64w" or the "sensors 64u, 64v, 64w) detect electric currents Igu, Igv, Igw flowing between the second inverter 54 and the generator 22.

More specifically, the sensor 64u detects electric current Igu (hereinafter also referred to as the "GEN electric current Igu" or the "U-phase electric current Igu") flowing through the bus bar 194u connecting the U-phase arm 188u and the U-phase terminal 192u of the generator 22. The sensor 64v detects electric current Igv (hereinafter also referred to as the "GEN electric current Igv" or the "V-phase electric current Igv") flowing through the bus bar 194v connecting the V-phase arm 188v and the V-phase terminal 192v of the generator 22. The sensor 64w detects electric current Igw (hereinafter also referred to as the "GEN electric current Igw" or the "W-phase electric current Igw") flowing through the bus bar 194w connecting the W-phase arm 188w and the W-phase terminal 192w of the generator 22.

Hereinafter, the GEN electric current sensors 64u, 64v, 64w will be referred to as the GEN electric current sensor 64 or the sensor 64 collectively. Further, the electric currents Igu, Igv, Igw will be referred to as the electric current Ig collectively. In the embodiment of the present invention, the number of the sensors 64 is three.

Alternatively, the number of the sensors 64 may be two or four or more.

A-1-5-8-2. Specific Structure of GEN Electric Current Sensors 64u, 64v, 64w

The GEN electric current sensors 64u, 64v, 64w have the same structure as the reactor electric current sensors 60a, 60b and the TRC electric current sensors 62u, 62v, 62w. That is, each of the sensors 64u, 64v, 64w includes the Hall element IC 210 (FIG. 5), the magnetic core 212, and a substrate 214c common to the sensors 64u, 64v, 64w (FIG. 6, etc.). A wiring line 300c is connected to one end of the substrate 214c through a connector 216c. The wiring line 300c will be described later with reference to FIGS. 6 to 9.

A-1-5-9. ECU 66

The ECU 66 is a control circuit (or control device) for controlling components of the PCU 26. As shown in FIG. 1, the ECU 66 includes an input/output unit 270, a computation unit 272, and a storage unit 274. The input/output unit 270 inputs/outputs signals to/from components of the vehicle 10 through a signal line 280 (communications line). In FIG. 1, it should be noted that the communications line 280 is shown in a simplified form. The input/output unit 270 includes an A/D converter circuit (not shown) for converting an inputted analog signal to a digital signal.

The computation unit 272 includes a central computation unit (CPU), and the computation unit 272 is operated by executing a program stored in the storage unit 274. The computation unit 272 includes a microcomputer 290 (FIG. 12) described later for measuring electric current. Some of the functions of the computation unit 272 may be realized by a logic IC (integrated circuit). The program may be supplied from the outside through a wireless communications device (not shown) (portable phone, smart phone, etc.). In the computation unit 272, part of the program may be made up of hardware (circuit component part).

The computation unit 272 of the embodiment of the present invention performs switching of the reactor 80 using a certain value, e.g., in the range of 10 to 20 kHz. Further, the computation unit 272 (microcomputer 290) converts outputs from the TRC electric current sensors 62u, 62v, 62w and the GEN electric current sensors 64u, 64v, 64w into digital values, and uses the digital values.

The storage unit 274 stores programs and data used by the computation unit 272, and includes a random access memory (hereinafter referred to as the "RAM"). As the RAM, a volatile memory such as a register, and a non-volatile memory such as a flash memory may be used. Further, the storage unit 274 may include a read only memory (hereinafter referred to as the "ROM"), in addition to the RAM.

A-1-5-10. Wiring Lines 300a to 300c

A-1-5-10-1. Overview of Wiring Lines 300a to 300c

FIG. 6 is a side view schematically showing the layout of a part of the PCU 26 according to the embodiment. FIG. 7 is a bottom view schematically showing the layout of a part of the PCU 26 according to the embodiment. FIG. 8 is a front view schematically showing the layout of a part of the PCU 26 according to the embodiment. As described above, the directions shown in FIGS. 6 to 8 are based on the vehicle 10.

A reference numeral 500 in FIGS. 6 and 8 is a switching unit formed by assembling switching elements of the converter 50, the first inverter 52, and the second inverter 54. The switching unit 500 (electric circuit) includes lower switching elements 82a, 82b and upper switching elements 84a, 84b of the converter 50, upper switching elements 150u, 150v, 150w and lower switching elements 152u, 152v, 152w of the first inverter 52, and upper switching elements 180u, 180v, 180w and lower switching elements 182u, 182v, 182w of the second inverter 54. The switching unit 500 includes the ECU 66 as well.

The wiring line 300a electrically connects the reactor electric current sensors 60a, 60b and the ECU 66. The wiring line 300b electrically connects the TRC electric current sensors 62u, 62v, 62w and the ECU 66. The wiring line 300c electrically connects the GEN electric current sensors 64u, 64v, 64w and the ECU 66. The wiring lines 300a, 300b, 300c are inserted into a resin cover 302 (FIGS. 6 to 9), and bundled together.

A-1-5-10-2. Wiring Line 300a

Figure 9:
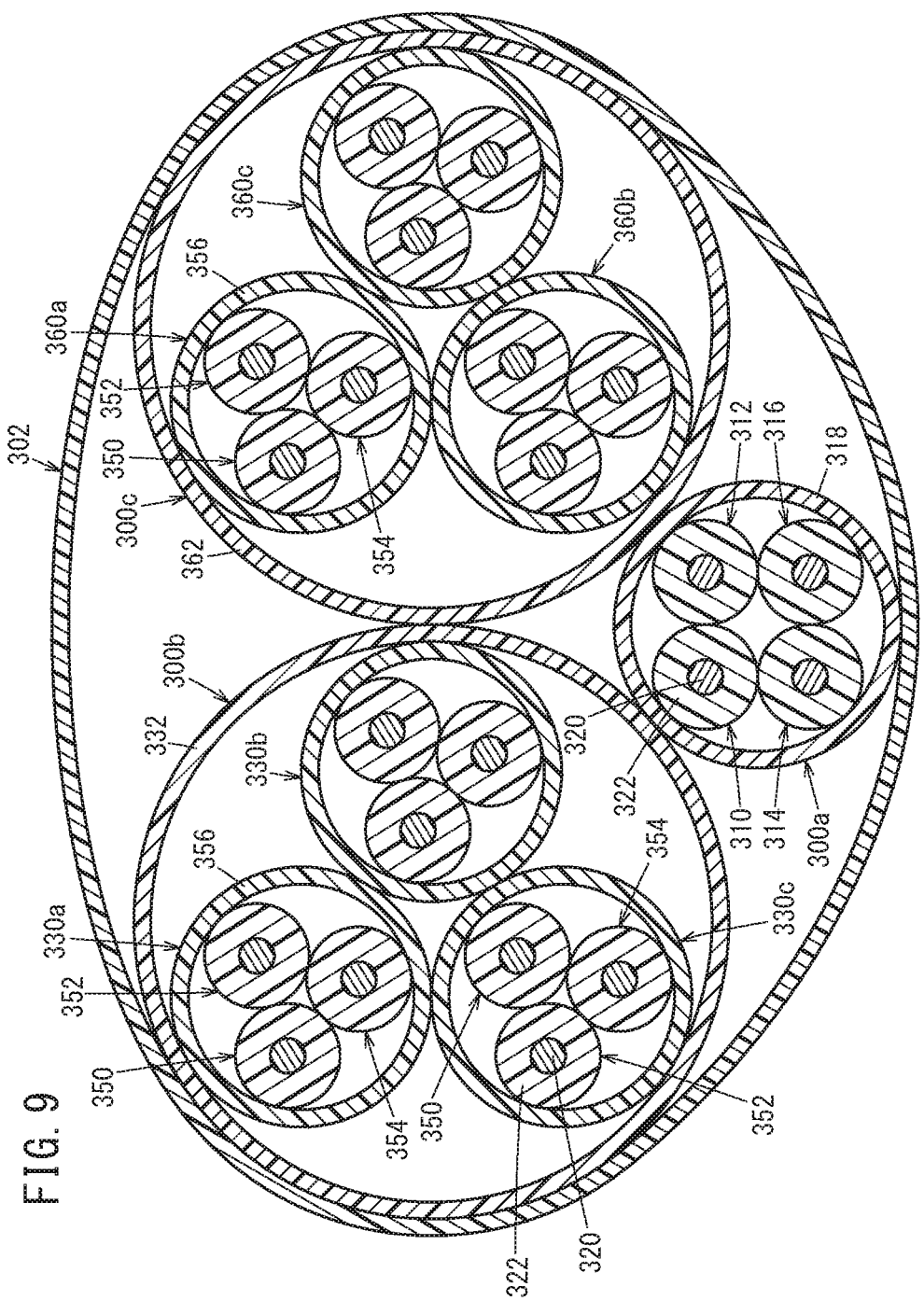
FIG. 9 is a cross sectional view showing structure of a plurality of wiring lines in the embodiment.

FIG. 9 is a cross sectional view showing structure of a plurality of wiring lines 300a, 300b, 300c in the embodiment of the present invention. The cross section in FIG. 9 is taken from a position before the wiring lines 300a, 300b, 300c enter the switching unit 500.

As shown in FIG. 9, the wiring line 300a includes a reference voltage electric line 310 (hereinafter also referred to as the "electric line 310"), a ground electric line 312 (hereinafter also referred to as the "electric line 312"), a first signal electric line 314 (hereinafter also referred to as the "first output signal electric line 314", the "electric line 314", the "first output signal line 314", or the "output signal line 314"), a second signal electric line 316 (hereinafter also referred to as the "second output signal electric line 316", the "electric line 316", the "second output signal line 316", or the "output signal line 316"), and a resin cover 318.

The reference voltage electric line 310 is connected to the reference voltage lines 232 of both of the reactor electric current sensors 60a, 60b, and used in common by the reactor electric current sensors 60a, 60b. The ground electric line 312 is connected to, and used in common by both of ground lines 234 of the reactor electric current sensors 60a, 60b. The first signal electric line 314 is connected to the signal line 242 of the reactor electric current sensor 60a. The second signal line 316 is connected to the signal line 242 of the reactor electric current sensor 60b.

Each of the electric lines 310, 312, 314, and 316 is a covered electric line including a core line 320 and a resin core line cover 322. A resin cover 318 (or sleeve) covers the bundled electric lines 310, 312, 314, 316. In the resin cover 318, the electric lines 310, 312, 314, 316 are twisted from one another (the detailed description will be given as an example of the GEN electric current sensor 64u with reference to FIG. 12).

As shown in FIGS. 6 and 7, the wiring line 300a is provided in parallel to axes (coil axes Ax1, Ax2) of the reactor 80, on a side the reactor 80. Further, as shown in FIGS. 6 and 7, the wiring line 300a is routed in upper/lower and left/right directions away from the axes (coil axes Ax1, Ax2) of the reactor 80, between the reactor electric current sensors 60a, 60b and the side of the reactor 80.

A-1-5-10-3. Wiring Line 300b

As shown in FIG. 9, the wiring line 300b includes a first cable set 330a, a second cable set 330b, a third cable set 330c, and a resin cover 332. The first cable set 330a connects the TRC electric current sensor 62u and the ECU 66. The second cable set 330b connects the TRC electric current sensor 62v and the ECU 66. The third cable set 330c connects the TRC electric current sensor 62w and the ECU 66.

The first cable set 330a includes a reference voltage electric line 350 (hereinafter also referred to as the "electric line 350"), a ground electric line 352 (hereinafter also referred to as the "electric line 352"), and a signal electric line 354 (hereinafter also referred to as the "electric line 354"), and a resin cover 356.

The reference voltage electric line 350 is connected to a reference voltage line 232 of the TRC electric current sensor 62u. The ground electric line 352 is connected to the ground line 234 of the TRC electric current sensor 62u. The signal electric line 354 is connected to the signal line 242 of the TRC electric current sensor 62u.

Same as the wiring line 300a, each of the electric lines 350, 352, 354 of the wiring line 300b is a covered electric line including a core line 320 and a resin core line cover 322. The electric lines 350, 352, 354 of the first cable set 330a are twisted from one another. In this state, the electric lines 350, 352, 354 of the first cable set 330a are bundled together, and provided inside the resin cover 356 (the detailed description about this point will be given as an example of the GEN electric current sensor 64u with reference to FIG. 12). The second and third cable sets 330b, 330c have the same structure.

The first to third cable sets 330a to 330c are bundled together by the resin cover 332. As shown in FIGS. 6 and 7, in the embodiment of the present invention, the merging point of the first to third cable sets 330a to 330c of the wiring line 300b is the closest to the ECU 66.

As shown in FIGS. 6 and 7, the wiring line 300b is provided such that the wiring line 300b enters the switching unit 500 without passing by the side of the reactor 80.

A-1-5-10-4. Wiring Line 300c

As shown in FIG. 9, the wiring line 300c includes a first cable set 360a, a second cable set 360b, a third cable set 360c, and a resin cover 362. The first cable set 360a connects the GEN electric current sensor 64u and the ECU 66. The second cable set 360b connects the GEN electric current sensor 64v and the ECU 66. The third cable set 360c connects the GEN electric current sensor 64w and the ECU 66.

Same as the first to third cable sets 330a to 330c of the wiring line 300b, the first cable set 360a of the wiring line 300c includes a reference voltage electric line 350, a ground electric line 352, a signal electric line 354, and a resin cover 356.

In the first cable set 360a, the reference voltage electric line 350 is connected to the reference voltage line 232 of the GEN electric current sensor 64u. The ground electric line 352 is connected to the ground line 234 of the GEN electric current sensor 64u. The signal electric line 354 is connected to the signal line 242 of the GEN electric current sensor 64u. The electric lines 350, 352, 354 of the first cable set 360a are twisted from one another, and in this state, the electric lines 350, 352, 354 are bundled together, and provided inside the resin cover 356 (the detailed description about this point will be given with reference to FIG. 12). The second and third cable sets 360b, 360c have the same structure.

As shown in FIGS. 6 and 7, the merging point of the cable sets 360a, 360b, 360c of the wiring line 300c is remoter than the merging point of the wiring line 300b, from the ECU 66. Stated otherwise, the wiring line 300a is merged with the wiring line 300c, before the wiring line 300b.

As shown in FIGS. 6 and 7, the wiring line 300c is provided in parallel to the axes of the reactor 80 (coil axes Ax1, Ax2) on the side of the reactor 80.

A-2. Relationship Between Wiring Lines 300a, 300b, 300c and Reactor 80

Next, the relationship between the wiring lines 300a, 300b, 300c and the reactor 80 (in particular, the influence of the leakage magnetic flux $\phi 1$ from the reactor 80 on the wiring lines 300a, 300b, 300c) will be described.

A-2-1. Reactor 80 and Electric Current Sensors 60a, 60b, 62u, 62v, 62w, 64u, 64v, 64w As shown in FIGS. 6 to 8, the magnetic coupling type reactor 80 is provided at a lower position of the PCU 26. In this regard, the coil axes Ax1, Ax2 are in alignment with the front/rear direction of the vehicle 10.

As shown in FIGS. 6 and 8, the TRC electric current sensors 62u, 62v, 62w, and the GEN electric current sensors 64u, 64v, 64w are provided above the reactor 80. Further, as shown in FIG. 7, the TRC electric current sensors 62u, 62v, 62w and the GEN electric current sensors 64u, 64v, 64w are shifted to the left side compared with the reactor 80.

Further, as shown in FIGS. 6 and 7, the TRC electric current sensors 62u, 62v, 62w and the GEN electric current sensors 64u, 64v, 64w are shifted from the reactor 80 in the front/rear direction. Specifically, the TRC electric current sensors 62u, 62v, 62w are provided on the rear side of the reactor 80. The GEN electric current sensors 64u, 64v, 64w are provided on the front side of the reactor 80.

As shown in FIG. 6, the positions of the TRC electric current sensors 62u, 62v, 62w and the positions of the GEN electric current sensors 64u, 64v, 64w in the upper/lower direction are the same. Further, the positions of the TRC electric current sensors 62u, 62v, 62w and the positions of the GEN electric current sensors 64u, 64v, 64w in the left/right direction are the same.

As shown in FIG. 6, in the front/rear direction, the TRC electric current sensors 62u, 62v, 62w and the GEN electric current sensors 64u, 64v, 64w are arranged in parallel. In this regard, the TRC electric current sensors 62u, 62v, 62w are remoter than the GEN electric current sensors 64u, 64v, 64w, from the reactor 80.

Further, as shown in FIG. 8, the bus bar 194w as a measurement target of the electric current sensor 64w extends in the upper/lower direction of the vehicle 10. The other bus bars 164u, 164v, 164w, 194u, 194v also extend in the upper/lower direction of the vehicle 10. In this regard, the main surfaces of the bus bars 164, 194 are oriented in the left/right direction of the vehicle 10.

A-2-2. Magnetic Field Generated by the Reactor 80 (Leakage Magnetic Flux ϕ1)

Figure 10:
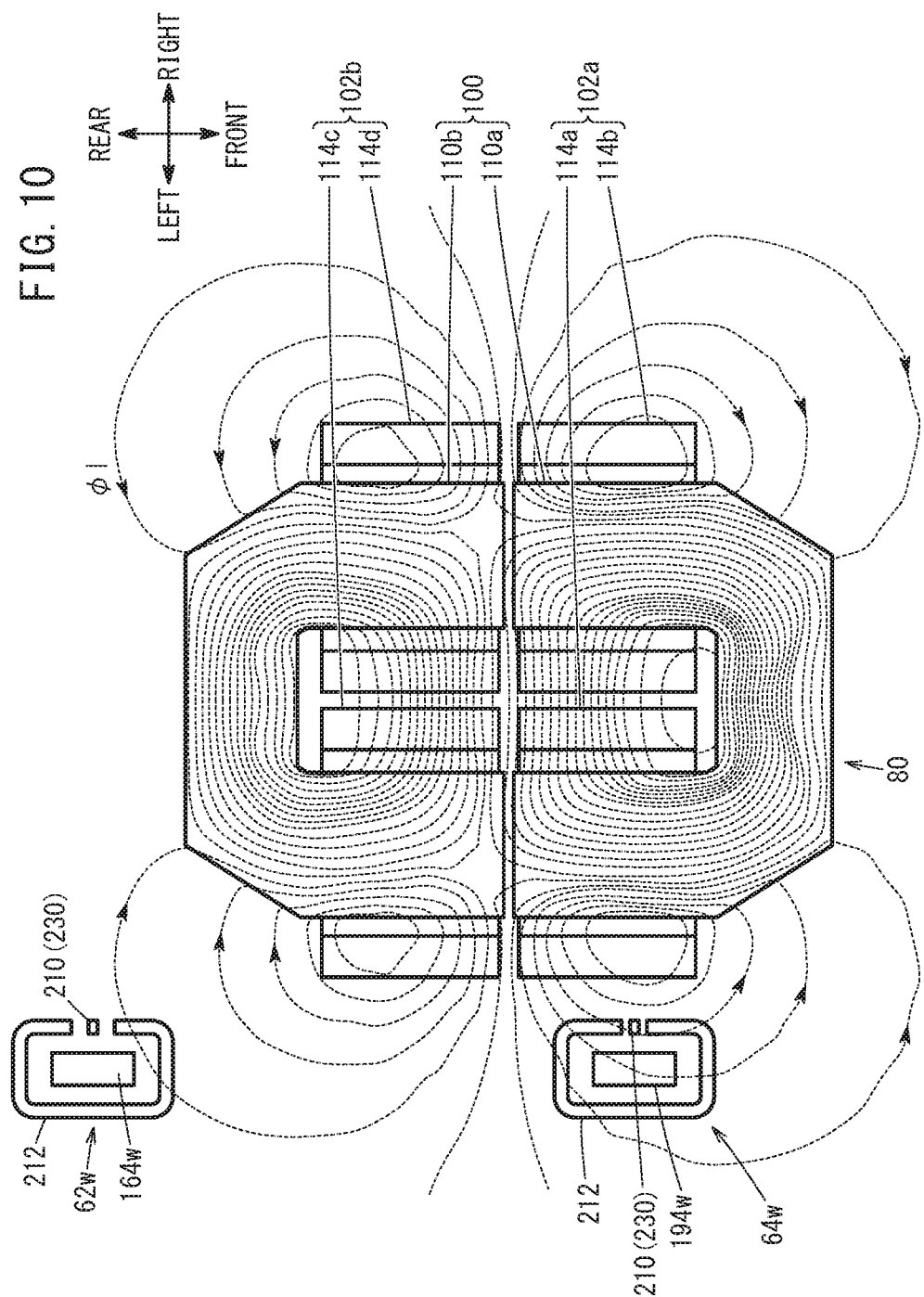
FIG. 10 is a plan view showing an example of magnetic field (leakage magnetic flux) generated by the reactor according to the embodiment.

FIG. 10 is a plan view showing one example of a magnetic field (leakage magnetic flux ϕ1) generated by the reactor 80 according to the embodiment of the present invention. In FIG. 10, though part of the reactor 80 (I-shaped cores 112a, 112b, etc.) is not shown, also in the case where the I-shaped cores 112a, 112b in FIG. 3 are included, the magnetic field has the same orientation and distribution. As shown in FIG. 10, in the magnetic coupling type reactor 80, a magnetic field is generated around each of the first winding part 114a, the second winding part 114b, the third winding part 114c, and the fourth winding part 114d.

As described above, in the embodiment of the present invention, switching of the lower switching elements 82a, 82b and the upper switching elements 84a, 84b is performed to change the orientation of the magnetic field (magnetic flux ϕ1). Therefore, it should be noted that the orientation of the magnetic field (magnetic flux ϕ1) shown in FIG. 10 is an example (typical direction).

A-2-3. Comparison Between the Embodiment of the Present Invention and the Comparative Example (Effects and Advantages of Wiring Lines 300a to 300c of the Embodiment of the Present Invention)

Next, effects and advantages of wiring lines 300a to 300c of the embodiment of the present invention will be described through comparison between the embodiment of the present invention and the comparative example shown in FIG. 11. The GEN electric current sensor 42u of FIG. 11 (comparative example) is the same as the electric current sensor 64u of the embodiment of the present invention. Further, the ECU 66 of FIG. 11 is the same as the ECU 66 of the embodiment of the present invention.

Figure 11:
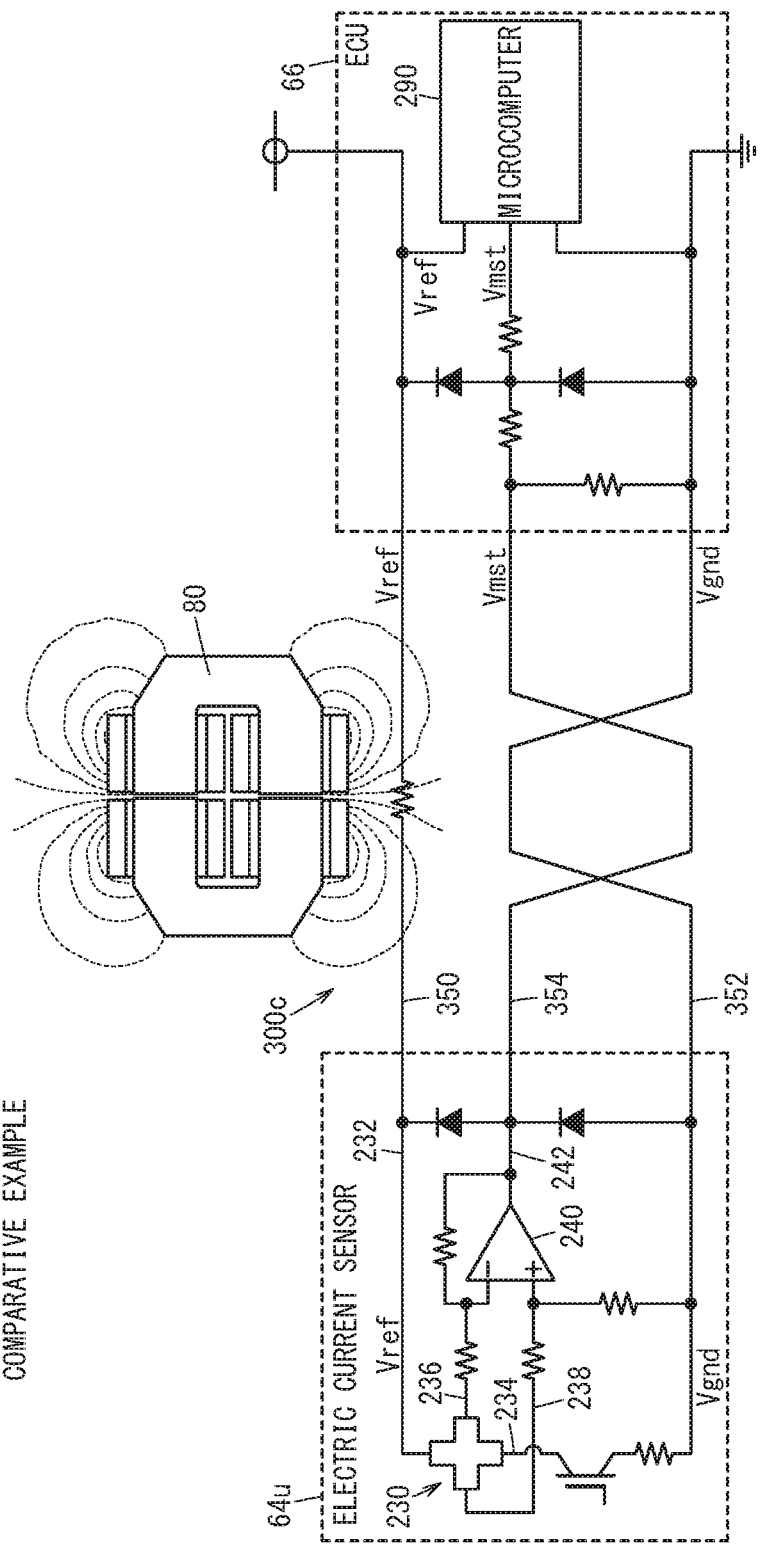
FIG. 11 is a view illustrating influence of the magnetic field (leakage magnetic flux) generated by the reactor on a wiring line in a comparative example.
Figure 12:
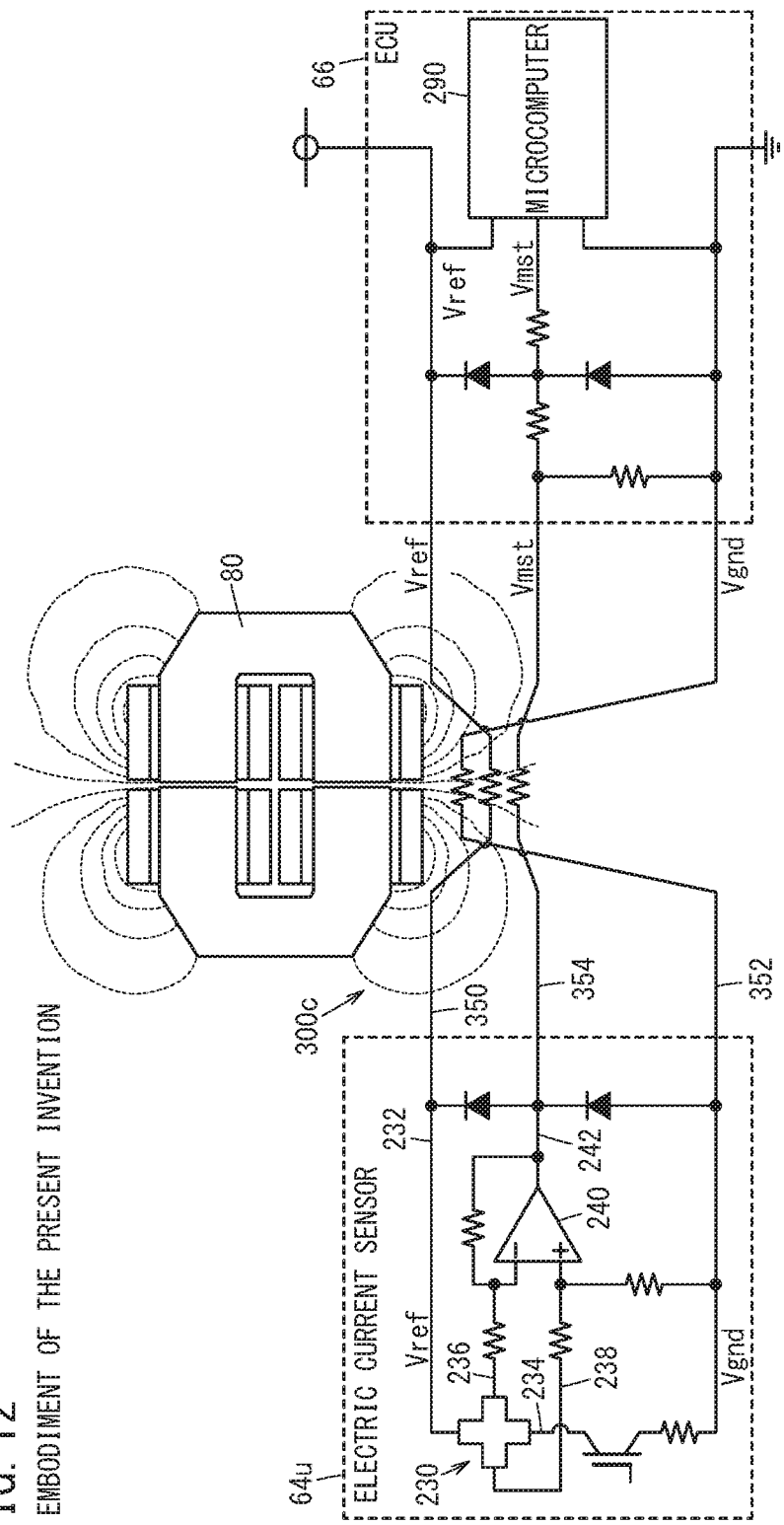
FIG. 12 is a view illustrating influence of the magnetic field (leakage magnetic flux) generated by the reactor on a wiring line in the embodiment of the present invention.

In FIGS. 11 and 12, the microcomputer 290 included in the ECU 66 calculates the electric current Igu based on the ratio R (=ΔV2/ΔV1) of the difference ΔV2 between the signal voltage Vmst and the ground voltage Vgnd (Vmst−Vgnd) to the difference ΔV1 between the reference voltage Vref and the ground voltage Vgnd (Vref−Vgnd). Instead of the ratio R, the difference ΔV3 between the difference ΔV1 and the difference ΔV2 (=ΔV1−ΔV2) may be used.

Though the case of the GEN electric current sensor 64u will be described with reference to FIGS. 11 and 12, the same principle is applicable to the other sensors 60a, 60b, 62u, 62v, 62w, 64v, 64w. However, as described above, as for the reactor electric current sensors 60a, 60b, since a common reference voltage electric line 310 and a common ground electric line 312 are used (FIG. 9), four electric lines 310, 312, 314, 316 are provided.

A-2-3-1. Comparative Example

FIG. 11 is a view illustrating influence of a magnetic field (leakage magnetic flux ϕ1) generated by the reactor 80 on a wiring line 300c in a comparative example. In the comparative example of FIG. 11, electric lines 352, 354 connected to the ground line 234 and the signal line 242 of the Hall element 230 are twisted from one another, and an electric line 350 connected to a reference voltage line 232 is provided singly at a position remote from electric lines 352, 354 without being bundled with the electric lines 352, 354.

In FIG. 11, the reference voltage electric line 350 is not bundled with the ground electric line 352 and the signal electric line 354. Therefore, for example, if noise components that are different from those of the ground electric line 352 and the signal electric line 354 are superimposed on the reference voltage electric line 350 by the magnetic field (leakage magnetic flux ϕ1) generated by the reactor 80, an error occurs in ΔV1. As a result an error occurs in the ratio R of ΔV2 to ΔV1 (=ΔV2/ΔV1) as well. Therefore, an error occurs in the electric current Igu calculated by the microcomputer 290.

The output from the Hall element 230 is converted into the voltage output, i.e., the signal voltage Vmst by the operational amplifier 240, and inputted to the microcomputer 290 through the signal electric line 354. As described above, the microcomputer 290 calculates the electric current Igu based on the ratio R of ΔV2 to ΔV1 (ΔV2/ΔV1).

A-2-3-2. Embodiment of the Present Invention

FIG. 12 is a view illustrating influence of the magnetic field (leakage magnetic flux ϕ1) generated by the reactor 80 on the wiring line 300c in the embodiment of the present invention. As shown in FIG. 12, in the wiring line 300c of the embodiment of the present invention, the reference voltage electric line 350, the ground electric line 352 and the signal electric line 354 are twisted, and bundled together. Therefore, when noises are generated in the electric lines 350, 352, 354 by the magnetic field (leakage magnetic flux ϕ1) generated by the reactor 80, noise components could be superimposed on the reference voltage Vref, the signal voltage Vmst, and the ground voltage Vgnd. However, since ΔV1 and ΔV2 are differences between the voltages, the noise components are cancelled, and consequently, the error in the electric current Igu calculated by the microcomputer 290 is suppressed.

In particular, in the embodiment of the present invention, the electric lines 350, 352, 354 are twisted from one another. Therefore, the relative position between the reactor 80 and the electric lines 350, 352, 354 is equalized. Consequently, the noise components superimposed on the electric lines 350, 352, 354 become substantially the same. Further, it becomes possible to suppress the error in the electric current Igu. As described above, as for the reactor electric current sensors 60a, 60b, since the common reference voltage electric line 310 and the common ground electric line 312 are used (FIG. 9), it should be noted that the four electric lines 310, 312, 314, 316 are twisted from one another.

A-3. Advantages of the Embodiment of the Present Invention

In the embodiment of the present invention, the reference voltage line 232, the ground line 234, and the output signal line 242 (reference voltage electric line 350, ground electric line 352, and the signal electric line 354) of the electric current sensor 64u are bundled together using the resin covers 302, 356, 362 (cylindrical members which do not contain metal). Therefore, the lines 232, 234, 242 are provided close to one another, and in this state, the lines 232, 234, 242 are held together (without using any metal shield lines such as braided wires) (FIGS. 9 and 12). In the structure, even if three lines 232, 234, 242 (electric lines 350, 352, 354) are influenced by the variable magnetic field around the reactor 80, the influence is applied equally to each of the three lines 232, 234, 242. Therefore, even in the case where the ECU 66 (control device) detects the electric current of the bus bar 194u (electric power line), e.g., based on the voltage difference between the reference voltage Vref and the voltage of the output signal Smst (both of the voltages are detected in relation with the ground voltage Vgnd), it becomes possible to suppress the detection error in the output signal Smst (i.e., electric current Itu). Also in the other electric current sensors 60a, 60b, 62u, 62v, 62w, 64v, 64w, the same advantage is obtained.

Further, in the embodiment of the present application, the reference voltage line 232, the ground line 234, and the output signal line 242 (reference voltage electric line 350, the ground electric line 352, and the signal electric line 354) of the electric current sensor 64u are bundled by the resin covers 302, 356, 362 which do not contain metal. In this state, the reference voltage line 232, the ground line 234, and the output signal line 242 of the electric current sensor 64u are routed inside the casing 68, and connected to the ECU 66 (FIGS. 6 to 8). In the case of using a cylindrical member containing metal (metal shield member, etc.), heat is generated in the shield member by eddy current generated in the variable magnetic field around the reactor 80. However, in the embodiment of the present invention, the lines 232, 234, 242 (electric lines 350, 352, 354) are bundled together using the resin covers 302, 356, 362 which does not contain metal. Therefore, it becomes possible to suppress heat generation around the reactor 80. Also in the other electric current sensors 60a, 60b, 62u, 62v, 62w, 64v, 64w, the same advantages is obtained.

In the embodiment of the present invention, the plurality of GEN electric current sensors 64u, 64v, 64w are provided inside the casing 68 (FIGS. 6 to 8). For each of the plurality of GEN electric current sensors 64u, 64v, 64w, one reference voltage line 232 (reference voltage electric line 350), one output signal line 242 (signal electric line 354), and one ground line 234 (ground electric line 352) are inserted into the one resin cover 356 (cylindrical member), and bundled together. In this state, the one reference voltage line 232, the one output signal line 242, and the one ground line 234 are routed inside the casing 68, and connected to the ECU 66 (control device) (FIGS. 6 to 9).

In this manner, it becomes possible to bundle the lines 232, 234, 242 (electric lines 350, 352, 354) for each of the sensors 64u, 64v, 64w. Therefore, in comparison with the case where the plurality of lines 232, 234, 242 (electric lines 350, 352, 354) are bundled together by one resin cover, it becomes easy to position the lines 232, 234, 242 (electric lines 350, 352, 354) for each of the electric current sensors 64u, 64v, 64w. Thus, for each of electric current sensors 64u, 64v, 64w, in the case where the ECU 66 detects electric current of the bus bars 194u, 194v, 194w (electric power lines), e.g., based on the difference between the reference voltage Vref and the voltage Vmst of the output signal Smst (both of the voltages are detected based on the relationship with the ground voltage Vgnd), it becomes possible to suppress detection errors in the output signals Smst (i.e., electric currents Igu, Igv, Igw). Also in the TRC electric current sensors 62u, 62v, 62w, the same advantages are obtained.

In the embodiment of the present invention, the plurality of reactor electric current sensors 60a, 60b are provided inside the casing 68 (FIGS. 6 to 8). For the plurality of reactor electric current sensors 60a, 60b, the common reference voltage electric line 310 (reference voltage line), the ground electric line 312, the first output signal electric line 314, and the second output signal electric line 316 are inserted into one resin cover 318 (cylindrical member), and bundled together. In this state, the common reference voltage electric line 310, the ground electric line 312, the first signal electric line 314, and the second signal electric line 316 are routed inside the casing 68, and connected to the ECU 66 (control device) (FIGS. 6 to 9). Thus, it becomes possible to bundle the reference voltage electric line 310, the ground electric line 312, the first signal electric line 314, and the second signal electric line 316 together. Therefore, using the reference voltage electric line 310 and the ground electric line 312 in common, it becomes possible to simplify the structure of the PCU 26 (electric equipment), and suppress the detection error in the output signal (i.e., reactor electric current Ir1, Ir2).

In the embodiment of the present invention, the lines 232, 234, 242 (electric lines 350, 352, 354) of the electric current sensor 64u are twisted from one another, and in this state, the lines 232, 234, 242 are bundled together by the resin covers 302, 356, 362 (cylindrical members) (FIGS. 9 and 12). In the above structure, since the lines 232, 234, 242 (electric lines 350, 352, 354) are twisted from one another, it is easy for the variable magnetic field around the reactor 80 to influence equally on each of the three lines 232, 234 242. Therefore, in comparison with the case where the three lines 232, 234, 242 extend straight without being twisted from one another, it becomes possible to suppress the detection error in the output signal Smst (i.e., electric currents Igu, Igv, Igw). Also in the other electric current sensors 60a, 60b, 62u, 62v, 62w, 64v, 64w, the same advantages are obtained.

In the embodiment of the present invention, the ECU 66 (control device) performs switching of the switching elements 82a, 82b, 84a, 84b using the maximum switching frequency in the range of 10 to 20 kHz.

The inventors of the present application found that, (even assuming that heat generation in the metal shield line is permissible), in the case where switching is performed in the range of 10 to 20 kHz, the metal shield line does not exert its function satisfactorily. In the embodiment of the present invention, even in the case where the reactor 80 is switched at the maximum switching frequency included in the above range, it becomes possible to suppress the detection error in the output signal Smst (i.e., electric current Itu, Itv, Itw).

In the embodiment of the present invention, with regard to the electric current sensors 64u, 64v, 64w, the lines 232, 234, 242 (electric lines 350, 352, 354) bundled by the resin covers 302, 356, 362 (cylindrical members) are provided substantially in parallel with the axes (coil axes Ax1, Ax2) of the reactor 80 inside the casing 68 (FIGS. 6 to 8). Therefore, it becomes possible to adjust the orientations of the three lines 232, 234, 242 (electric lines 350, 352, 354) to become closer to the orientation of the magnetic flux Φ, and suppress generation of noises in the three lines 232, 234, 242. Also in the other electric current sensors 60a, 60b, 62u, 62v, 62w, the same advantages are obtained.

In the embodiment of the present invention, with regard to the electric current sensors 64u, 64v, 64w, the reactor 80 is a magnetic coupling type reactor including four winding parts 114a to 114d (FIGS. 2 and 3). Therefore, in a situation where the orientation of the magnetic field B changes in the four winding parts 114a to 114d, even in the case where the three lines 232, 234, 242 (electric lines 350, 352, 354) are provided around the reactor 80, it becomes possible to suppress the detection error in the output signal Smst (i.e., electric currents Itu, Itv, Itw). Also in the other electric current sensors 60a, 60b, 62u, 62v, 62w, the same advantages are obtained.

In the embodiment of the present invention, the output signal line 242 is an output signal line of the operational amplifier 240 for outputting the voltage difference between the two output lines 236, 238 connected to the Hall element 230 (FIGS. 5 and 12). Therefore, by bundling the output signal line 242 (signal electric line 354) together with the reference voltage electric line 232 (reference voltage electric line 350) after detection of the voltage difference between the two output lines 236, 238, since the similar noises are introduced into both of the reference voltage line 232 and the output signal line 242, it becomes possible to suppress variation in the readout values.

B. Modified Embodiments

The present invention is not limited to the above described embodiment. It is a matter of course that various structures can be adopted based on the description of the specification. For example, the following structure can be adopted.

B-1. Target Applications

The vehicle 10 according to the above embodiment includes the traction motor 20, the generator 22, and the engine (not shown) (FIG. 1). However, for example, in terms of bundling, and routing the lines 232, 234, 242 (electric lines 350, 352, 354, etc.), the present invention is not limited in this respect. For example, the vehicle 10 may have structure including a plurality of traction motors 20 and the generators 22.

B-2. Rotating Electric Machine

In the embodiment of the present invention, the traction motor 20 and the generator 22 adopt a three-phase AC brushless type (FIG. 1). However, for example, in terms of bundling, and routing the lines 232, 234, 242 (electric lines 350, 352, 354, etc.), the present invention is not limited in this respect. The traction motor 20 and the generator 22 may adopt a DC type or a brush type.

B-3. Reactor 80

In the embodiment of the present invention, the reactor 80 is a magnetic coupling type reactor (FIGS. 1 to 3). However, for example, in terms of bundling, and routing the lines 232, 234, 242 (electric lines 350, 352, 354, etc.), the present invention is not limited in this respect. For example, the reactor 80 may adopt a type including only one coil (normal drive scheme) or may adopt a type including two coils arranged in parallel (interleave scheme), etc.

In the embodiment of the present invention, the reactor 80 has been taken as an example of the source of generating the magnetic field. However, the present invention is applicable to other sources of generating the magnetic field as well.

B-4. Electric Current Sensors 60, 62, 64

In the embodiment of the present application, wiring lines 300a to 300c of eight electric current sensors 60, 62, 64 have been described (FIGS. 6 to 9, etc.). However, for example, in terms of bundling, and routing the lines 232, 234, 242 (electric lines 350, 352, 354, etc.), the present invention is not limited in this respect. It is sufficient that the number electric current sensors is at least two. For example, the number of electric current sensors may be any of 2 to 50. Further, for failsafe purpose, etc., it may be possible to provide two electric current sensors (e.g., sensor 62u) for the same bus bars 164, 194, 202 (e.g., bus bar 164u).

The sensors 60, 62, 64 of the above describe embodiment includes the Hall element 230 (Hall IC 210) (FIG. 5). However, for example, in terms of bundling, and routing the lines 232, 234, 242 (electric lines 350, 352, 354, etc.), the present invention is not limited to these types of the sensors 60, 62, 64. For example, the present invention may be applicable to the magnetic sensor other than the Hall element 230 (Hall IC 210) or other sensors.

In the above embodiment, the sensors 60a, 60b are arranged in one line in the left-right direction (FIGS. 4, and 6 to 8). However, for example, in terms of bundling, and routing the lines 232, 234, 242 (electric lines 310, 312, 314, 316 etc.), the present invention is not limited in this respect. The sensors 62u, 62v, 62w, 64u, 64v, and 64w are not limited in this respect as well.

In the above embodiment, the cores 212 of the sensors 60a, 60b are oriented in the same direction (FIG. 4, etc.). However, for example, in terms of bundling, and routing the lines 232, 234, 242 (electric lines 310, 312, 314, 316 etc.), the present invention is not limited in this respect. For example, in the above embodiment, in a plan view, though the gap 260 is provided on a side of the core 212 closer to the reactor 80 (FIGS. 6 to 8), the gap 260 may be provided at another position. Further, the present invention is not limited to the above described sensors 62u, 62v, 62w, 64u, 64v, 64w.

In the above embodiment, as the cylindrical members which does not contain metal, the resin covers 302, 318, 332, 356, 362 are used (FIG. 9). However, for example, in terms of bundling, and routing the lines 232, 234, 242 (electric lines 310, 312, 314, 316, 350, 352, 354), the present invention is not limited in this respect. In addition to the resin covers 302, 318, 332, 356, 362, or instead of the resin covers 302, 318, 332, 356, 362, resin tapes or resin tubes may be used.

What is claimed is:

1. Electric equipment comprising:
   a reactor;
   a switching element connected to the reactor;
   a control device configured to control switching of the switching element; and
   an electric current sensor provided around the reactor, and configured to detect electric current flowing through an electric power line,
   wherein the electric current sensor includes:
   a detection element;
   a reference voltage line to which a reference voltage signal is transmitted;
   an output signal line to which an output signal of the detection element is transmitted;
   a ground line connected to a ground potential,
   wherein the reference voltage line, the output signal line, and the ground line are bundled together by a common cylindrical member, wherein the cylindrical member is a cover that does not contain metal, and wherein the reference voltage line, the output signal line, and the ground line are routed from one end to another end of an axis of a coil on a side of the reactor inside a casing containing the reactor, and connected to the control device.

2. The electric equipment according to claim 1, wherein a plurality of the electric current sensors are provided inside the casing; and for each of the plurality of electric current sensors, in a state where the one reference voltage line, the one output signal line, and the one ground line are inserted into the one cylindrical member, and bundled together, the one reference voltage line, the one output signal line, and the one ground line are routed inside the casing, and connected to the control device.

3. The electric equipment according to claim 1, wherein in a state where the reference voltage line, the output signal line, and the ground line are twisted from one another, and the reference voltage line, the output signal line, and the ground line are inserted into the cylindrical member and bundled together.

4. The electric equipment according to claim 1, wherein a plurality of the electric current sensors are provided inside the casing, wherein the plurality of electric current sensors include:
a common reference voltage line to which a reference voltage signal is transmitted;
a first output signal line and a second output signal line to each of which an output signal of the detection element is transmitted individually; and
a common ground line connected to a ground potential, and wherein in a state where the reference voltage line, the first output signal line, the second output signal line, and the ground line are inserted into the one cylindrical member and bundled together, and the reference voltage line, the first output signal line, the second output signal line, and the ground line are routed inside the casing, and connected to the control device.

5. The electric equipment according to claim 1, wherein the control device is configured to switch the switching element using a maximum switching frequency included in a range of 10 to 20 kHz.

6. The electric equipment according to claim 1, wherein the reference voltage line, the output signal line, and the ground line bundled with the cylindrical member are provided substantially in parallel with an axis of the reactor inside the casing.

7. The electric equipment according to claim 6, wherein the reactor is a magnetic coupling type reactor including four winding parts.

8. The electric equipment according to claim 1, wherein the detection element is a Hall element; and the output signal line is an output signal line of an operational amplifier configured to output a voltage difference of two output lines connected to the Hall element.

9. Electric equipment comprising:
a reactor;
a switching element connected to the reactor;
a control device configured to control switching of the switching element; and
an electric current sensor provided around the reactor, and configured to detect electric current flowing through an electric power line, wherein the electric current sensor includes:
a detection element;
a reference voltage line to which a reference voltage signal is transmitted;
an output signal line to which an output signal of the detection element is transmitted;
a ground line connected to a ground potential, wherein the reference voltage line, the output signal line, and the ground line are bundled together by a cylindrical member, wherein the cylindrical member is a cover that does not contain metal, wherein the reference voltage line, the output signal line, and the ground line are routed inside a casing containing the reactor, and connected to the control device, wherein a plurality of electric current sensors are provided inside the casing, and wherein the plurality of electric current sensors include:
a common reference voltage line to which a reference voltage signal is transmitted;
a first output signal line and a second output signal line to each of which an output signal of the detection element is transmitted individually;
a common ground line connected to the ground potential, and wherein in a state where the reference voltage line, the first output signal line, the second output signal line, and the ground line are inserted into the one cylindrical member and bundled together, and the reference voltage line, the first output signal line, the second output signal line, and the ground line are routed inside the casing, and connected to the control device.

* * * * *